US009761587B2

(12) United States Patent
Balakrishnan et al.

(10) Patent No.: US 9,761,587 B2
(45) Date of Patent: Sep. 12, 2017

(54) TALL STRAINED HIGH PERCENTAGE SILICON GERMANIUM FINS FOR CMOS

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/344,232

(22) Filed: Nov. 4, 2016

(65) Prior Publication Data

US 2017/0170182 A1 Jun. 15, 2017

Related U.S. Application Data

(62) Division of application No. 14/963,740, filed on Dec. 9, 2015, now Pat. No. 9,496,260.

(51) Int. Cl.
*H01L 21/84* (2006.01)
*H01L 27/092* (2006.01)
(Continued)

(52) U.S. Cl.
CPC .... *H01L 27/0924* (2013.01); *H01L 21/02532* (2013.01); *H01L 21/823821* (2013.01);
(Continued)

(58) Field of Classification Search
CPC ............. H01L 27/0924; H01L 29/7842; H01L 21/823878; H01L 21/02532;
(Continued)

(56) References Cited

U.S. PATENT DOCUMENTS 8,841,178 B1   9/2014  Basker et al.
8,883,578 B2   11/2014 Basker et al.
(Continued)

OTHER PUBLICATIONS

List of IBM Patents or Patent Applications Treated as Related dated Nov. 4, 2016, 2 pages.

*Primary Examiner* — Jarrett Stark
*Assistant Examiner* — Bitew Dinke
(74) *Attorney, Agent, or Firm* — Scully, Scott, Murphy & Presser, P.C.; Louis J. Percello, Esq.

(57) ABSTRACT

A silicon germanium alloy (SiGe) fin having a first germanium content is provided within first and second device regions. Each SiGe fin is located on a sacrificial material stack and an oxide material surrounds each SiGe fin. A germanium layer is formed atop each SiGe fin within one of the device regions, while a SiGe layer having a second germanium content less than the first germanium content is formed atop each SiGe fin within the other device region. An exposed surface of each of the germanium layer and the SiGe layer is then bonded to a base substrate. The sacrificial material stack is removed and thereafter the oxide material is recessed to expose a portion of each SiGe fin in the first and second device regions. Each SiGe fin contacting the germanium layer compressively strained, and each SiGe fin contacting the SiGe layer is tensely strained.

20 Claims, 16 Drawing Sheets

(51) Int. Cl.
*H01L 29/165* (2006.01)
*H01L 29/06* (2006.01)
*H01L 21/02* (2006.01)
*H01L 21/8238* (2006.01)
*H01L 29/78* (2006.01)

(52) U.S. Cl.
CPC .. *H01L 21/823878* (2013.01); *H01L 29/0649* (2013.01); *H01L 29/165* (2013.01); *H01L 29/7842* (2013.01)

(58) Field of Classification Search
CPC ......... H01L 21/823821; H01L 29/0649; H01L 29/165; H01L 21/823431; H01L 21/845; H01L 27/0886
See application file for complete search history.

(56) References Cited

U.S. PATENT DOCUMENTS

| | | |
|---|---|---|
| 8,927,363 B2 | 1/2015 | Cheng et al. |
| 8,951,870 B2 | 2/2015 | Basker et al. |
| 9,514,990 B2 * | 12/2016 | Liu .................... H01L 21/82343 |
| 9,524,969 B1 * | 12/2016 | Balakrishnan ...... H01L 27/0924 |
| 2012/0319211 A1 * | 12/2012 | van Dal ............ H01L 29/66795 257/401 |
| 2014/0008730 A1 * | 1/2014 | Mitard ................. H01L 27/092 257/369 |
| 2014/0264602 A1 | 9/2014 | Basker et al. |
| 2015/0097239 A1 * | 4/2015 | Chen .................... H01L 23/3171 257/347 |
| 2015/0145048 A1 | 5/2015 | Cheng et al. |
| 2015/0194307 A1 * | 7/2015 | Gaire ................. H01L 29/66795 257/190 |
| 2015/0311341 A1 * | 10/2015 | Hur .................. H01L 21/02532 257/190 |
| 2016/0027876 A1 * | 1/2016 | Lee ..................... H01L 29/1054 257/369 |
| 2016/0035727 A1 * | 2/2016 | Brunco ............... H01L 27/0924 257/369 |
| 2016/0284695 A1 * | 9/2016 | Liaw .................... H01L 27/088 |
| 2016/0379981 A1 * | 12/2016 | Balakrishnan ...... H01L 27/0924 257/192 |
| 2017/0077231 A1 * | 3/2017 | Balakrishnan ...... H01L 29/1054 |

* cited by examiner

TALL STRAINED HIGH PERCENTAGE SILICON GERMANIUM FINS FOR CMOS

BACKGROUND

The present application relates to semiconductor technology. More particularly, the present application relates to a semiconductor structure containing a plurality of tall intrinsically strained high germanium percentage silicon germanium alloy fins and a method of forming the same.

The use of non-planar semiconductor devices such as, for example, silicon fin field effect transistors (FinFETs) is the next step in the evolution of complementary metal oxide semiconductor (CMOS) devices. Silicon fin field effect transistors (FETs) can achieve higher drive currents with increasingly smaller dimensions as compared to conventional planar FETs. In order to extend these devices for multiple technology nodes such as, for example, 10 nm and beyond, there is a need to boost the performance with high-mobility channels.

In such FinFET devices, a fin containing a silicon germanium alloy is one promising channel material because of its high-carrier mobility. Future technology nodes look towards silicon germanium alloys having a high germanium content (greater than 50 atomic percent germanium) as an enabling element for performance improvements. The band structure of silicon germanium alloys becomes more germanium like for germanium contents at, and above, 85 atomic percent. High germanium percentage silicon germanium alloy fins need to be on a bulk silicon substrate or a silicon-on-insulator substrate with current CMOS technology. Further performance gains might come from straining the high germanium percentage silicon germanium alloy fins. Straining high germanium percentage silicon germanium alloy fins intrinsically, rather than the challenging approach of external strain introduction by source/drain epitaxy might lead to much higher strain in high germanium percentage silicon germanium alloy fins.

SUMMARY

A silicon germanium alloy (SiGe) fin having a first germanium content is provided within first and second device regions. Each SiGe fin is located on a sacrificial material stack and an oxide material surrounds each SiGe fin. A germanium layer is formed atop each SiGe fin within one of the device regions, while a SiGe layer having a second germanium content less than the first germanium content is formed atop each SiGe fin within the other device region. An exposed surface of each of the germanium layer and the SiGe layer is then bonded to a base substrate. The sacrificial material stack is removed and thereafter the oxide material is recessed to expose a portion of each SiGe fin in the first and second device regions. Each SiGe fin contacting the germanium layer is compressively strained, and each SiGe fin contacting the SiGe layer is tensely strained.

In one aspect of the present application, a method of forming a semiconductor structure is provided. In one embodiment of the present application, the method may include forming at least one silicon germanium alloy fin having a first germanium content within a first device region and within a second device region, wherein each silicon germanium alloy fin is located on a sacrificial material stack and wherein an oxide material is located on sidewall surfaces of each silicon germanium alloy fin. A germanium layer is formed atop each silicon germanium alloy fin within one of the device regions, while a silicon germanium alloy layer having a second germanium content that is less than the first germanium content is formed atop each silicon germanium alloy fin within another of the device regions not including the germanium layer. The forming of the germanium layer and the silicon germanium alloy layer may occur in any order. Next, an exposed surface of each of the germanium layer and the silicon germanium alloy layer is bonded to a base substrate. The sacrificial material stack is then removed and thereafter the oxide material is recessed to expose a portion of each silicon germanium alloy fin in the first and second device regions. In accordance with the present application, each silicon germanium alloy fin contacting the germanium layer is compressively strained, and each silicon germanium alloy fin contacting the silicon germanium alloy is tensely strained.

In another aspect of the present application, a semiconductor structure is provided. In one embodiment of the present application, the semiconductor structure may include a compressively strained silicon germanium alloy fin of a first germanium content extending upwards from a surface of a germanium layer. The structure further includes a tensely strained silicon germanium alloy fin of the first germanium content extending upwards from a surface of a silicon germanium alloy layer having a second germanium content that is less than the first germanium content. In accordance with the present application, the germanium layer and the silicon germanium alloy layer are spaced apart from each other.

DETAILED DESCRIPTION

Figure 1:
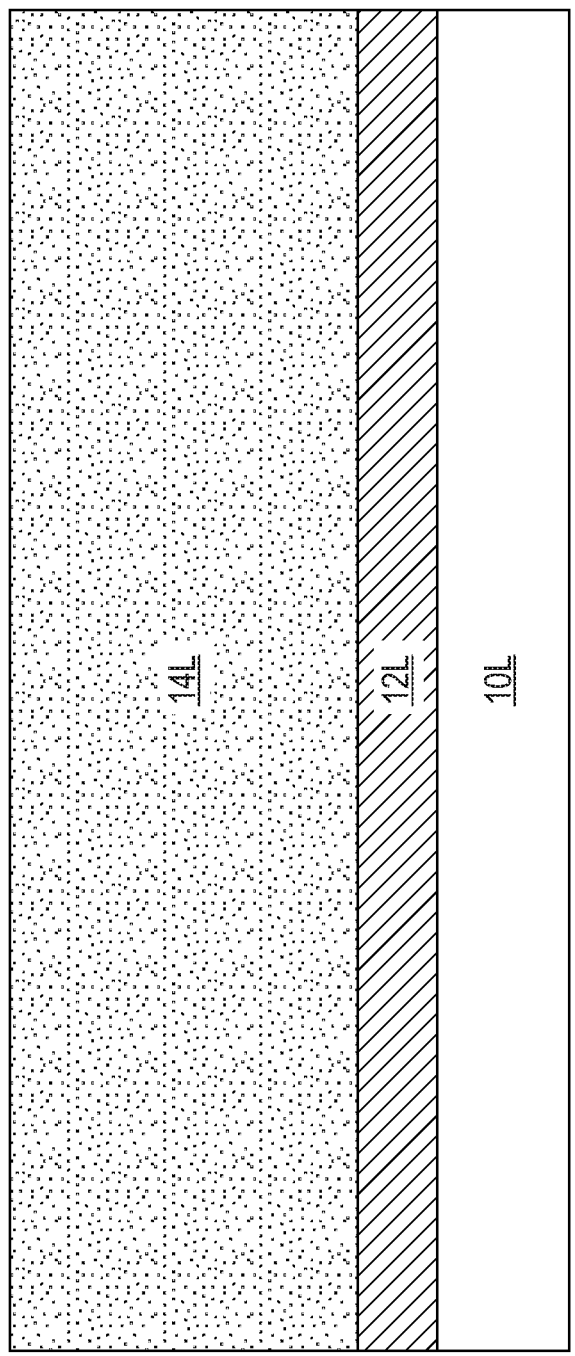
FIG. 1 is a cross sectional view of an exemplary semiconductor structure including, from bottom to top, a sacrificial handle substrate, a sacrificial insulator layer and a silicon germanium alloy layer having a first germanium content that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure that can be employed in accordance with an embodiment of the present application. The exemplary semiconductor structure of FIG. 1 includes, from bottom to top, a sacrificial handle substrate 10L, a sacrificial insulator layer 12L and a silicon germanium alloy layer 14L having a first germanium content. Collectively, the sacrificial handle substrate 10L, the sacrificial insulator layer 12L and the silicon germanium alloy layer 14L may be referred to as a silicon germanium-on-insulator (SGOI) substrate.

In one embodiment of the present application, the sacrificial handle substrate 10L may include at least one semiconductor material that has semiconducting properties. Examples of materials that have semiconducting properties and thus can be employed as the semiconductor material that provides the sacrificial handle substrate 10L include silicon (Si), germanium (Ge), silicon germanium alloys (SiGe), silicon carbide (SiC), silicon germanium carbide (SiGeC), III-V compound semiconductors and/or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the sacrificial handle substrate 10L is composed entirely of silicon.

In another embodiment of the present application, the sacrificial handle substrate 10L may be composed of a non-semiconductor material including, for example, a dielectric material and/or a conductive material.

When the sacrificial handle substrate 10L is composed of at least one semiconductor material, the at least one semiconductor material that provides the sacrificial handle substrate 10L may be single crystalline, polycrystalline or amorphous. In one example, the sacrificial handle substrate 10L is composed of single crystalline silicon.

When the sacrificial handle substrate 10L is composed of at least one semiconductor material, the at least one semiconductor material that provides the sacrificial handle substrate 10L may have any of the well known crystal orientations. For example, the crystal orientation of the sacrificial handle substrate 10L may be {100}, {110}, or {111}. Other crystallographic orientations besides those specifically mentioned can also be used in the present application.

The sacrificial insulator layer 12L of the exemplary semiconductor structure shown in FIG. 1 may be a crystalline or non-crystalline dielectric material such as an oxide and/or nitride. In one embodiment, the sacrificial insulator layer 12L is a dielectric oxide such as, for example, silicon dioxide. In another embodiment of the present application, the sacrificial insulator layer 12L may be a dielectric nitride such as, for example, silicon nitride or boron nitride. In yet another embodiment of the present application, the sacrificial insulator layer 12L may include a stack of a dielectric oxide and a dielectric nitride. In one example, a stack of, in any order, silicon dioxide and silicon nitride or boron nitride may be employed as the sacrificial insulator layer 12L. The sacrificial insulator layer 12L may have a thickness from 10 nm to 200 nm, although other thicknesses that are lesser than, or greater than, the aforementioned thickness range may also be employed as the thickness of the sacrificial insulator layer 12L.

The silicon germanium alloy layer 14L includes a relaxed silicon germanium alloy. In one embodiment of the present application, the first germanium content of the silicon germanium alloy layer 14L can be from 70 atomic percent to 90 atomic percent. Other first germanium contents that are lesser than, or greater than, the aforementioned range can also be employed as the first germanium content of the silicon germanium alloy layer 14L. In one embodiment, the sacrificial handle substrate 10L and the silicon germanium alloy layer 14L both comprise a silicon germanium alloy.

The silicon germanium alloy layer 14L may have one of the crystal orientations mentioned above for the semiconductor material that provides the sacrificial handle substrate 10L. In one embodiment, the crystal orientation of the silicon germanium alloy layer 14L is the same as the crystal orientation of the sacrificial handle substrate 10L. In another embodiment, the crystal orientation of the silicon germanium alloy layer 14L differs from the crystal orientation of the sacrificial handle substrate 10L. Typically, the silicon germanium alloy layer 14L is a single crystalline semiconductor material. The silicon germanium alloy layer 14L may have a thickness from 20 nm to 300 nm, although other thicknesses that are lesser than, or greater than, the aforementioned thickness range may also be employed as the thickness of the silicon germanium alloy layer 14L.

In one embodiment, the SGOI substrate (10L, 12L, 14L) may be formed by wafer bonding. In yet another embodiment, the SGOI substrate (10L, 12L, 14L) may be formed by an implantation process known as SIMOX (i.e., Separation by IMplanting OXygen). In some embodiments of the present application, a thermal mixing process or a thermal condensation process may be employed in forming the silicon germanium alloy layer 14L. Thermal mixing includes annealing in an inert ambient (i.e., helium and/or argon), while thermal condensation includes annealing in an oxidizing ambient (air, oxygen, ozone and/or $NO_2$). The anneal temperature for both thermal mixing and thermal condensation can be from 600° C. to 1200° C. In such a process, a sacrificial silicon germanium alloy layer having an initial germanium content can be formed on a silicon layer that is located atop the sacrificial insulator layer. One of thermal mixing or thermal condensation can then be performed to convert the Si/SiGe material stack into a silicon germanium alloy layer having the first germanium content that differs from the initial germanium content.

Figure 2:
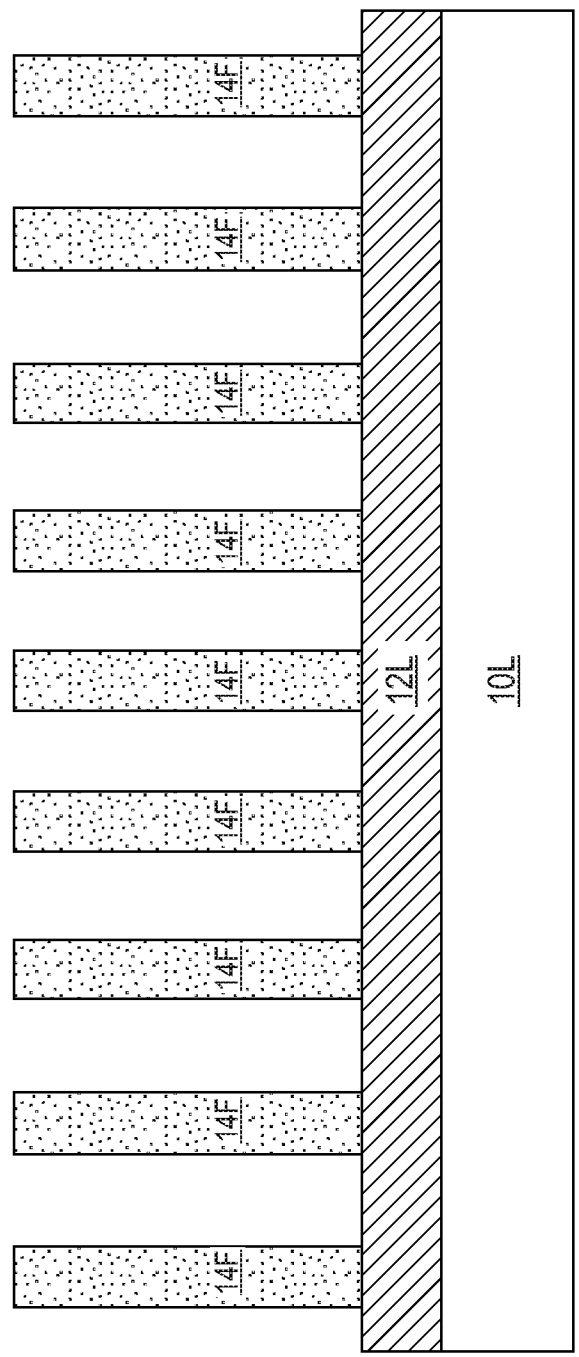
FIG. 2 is a cross sectional view of the exemplary semiconductor structure of FIG. 1 after patterning the silicon germanium alloy layer having the first germanium content to provide a plurality of silicon germanium alloy fins having the first germanium content.

Referring now to FIG. 2, there is illustrated the exemplary semiconductor structure of FIG. 1 after patterning the silicon germanium alloy layer 14L having the first germanium content to provide a plurality of silicon germanium alloy fins 14F having the first germanium content. Each silicon germanium alloy fin 14F is a relaxed fin at this point of the present application.

In one embodiment of the present application, the patterning used to provide the plurality of silicon germanium alloy fins 14F may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the illustrated embodiment, the etch stops on the topmost surface of the sacrificial insulator layer 12L.

In another embodiment of the present application, the patterning used to provide the plurality of silicon germanium alloy fins 14F may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer can be formed by deposition of a spacer material and then etching the deposited spacer material. The spacer material may comprise any material having an etch selectivity that differs from the mandrel material. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching.

After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. The etch stops on a topmost surface of the sacrificial insulator layer 12L. Upon completion of the pattern transfer, the SIT process concludes by removing the spacers from the structure. Each spacer may be removed by etching or a planarization process.

As used herein, a "silicon germanium alloy fin" refers to a remaining portion of the silicon germanium alloy layer and including a pair of vertical sidewalls that are parallel to each other. As used herein, a surface is "vertical" if there exists a vertical plane from which the surface does not deviate by more than three times the root mean square roughness of the surface. In one embodiment of the present application, each silicon germanium alloy fin 14F has a width from 5 nm to 30 nm. Other widths that are lesser than, or greater than the range mentioned herein can also be used in the present application. The height of each silicon germanium alloy fin 14F is determined by the thickness of the silicon germanium alloy layer 14L. Each silicon germanium alloy fin 14F is spaced apart from its nearest neighboring silicon germanium alloy fin 14F by a pitch of from 20 nm to 100 nm. Also, each silicon germanium alloy fin 14F is oriented parallel to each other.

Figure 3:
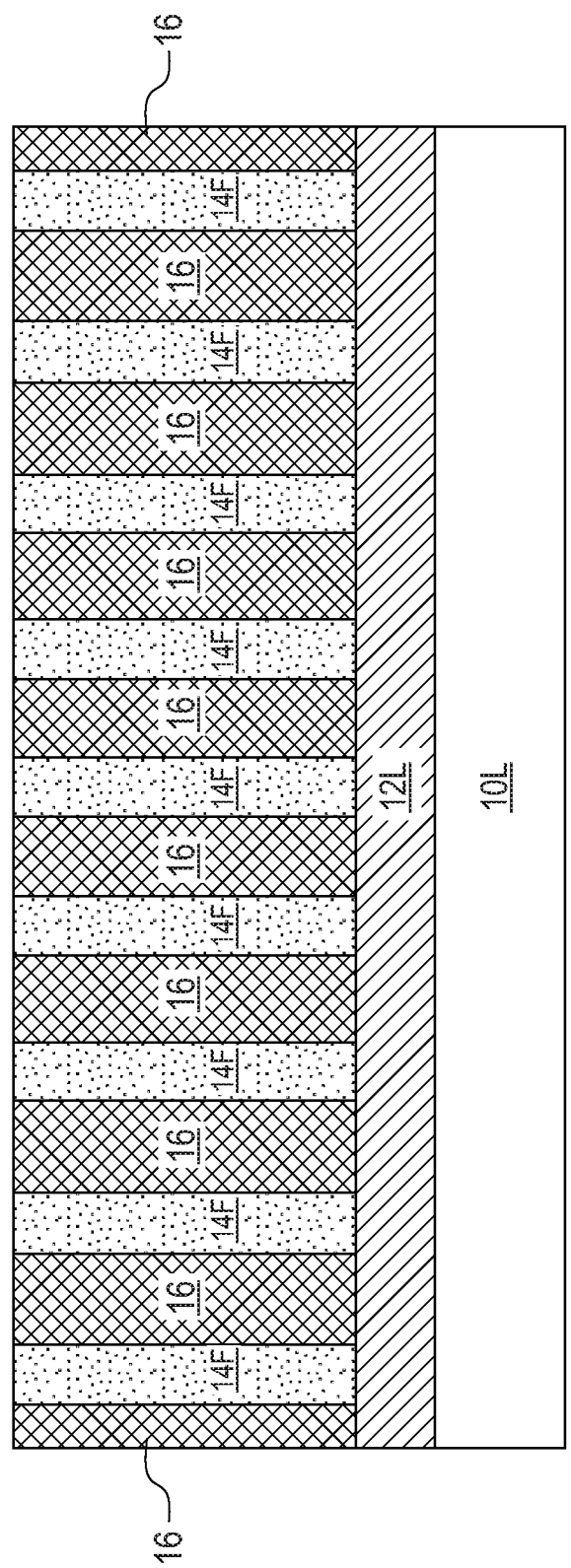
FIG. 3 is a cross sectional view of the exemplary semiconductor structure of FIG. 2 after forming an oxide material between each silicon germanium alloy fin, wherein the oxide material has a topmost surface that is coplanar with a topmost surface of each silicon germanium alloy fin.

Referring now to FIG. 3, there is illustrated the exemplary semiconductor structure of FIG. 2 after forming an oxide material 16 between each silicon germanium alloy fin 14F, wherein the oxide material 16 has a topmost surface that is coplanar with a topmost surface of each silicon germanium alloy fin 14F. As is shown, the bottommost surface of the oxide material 16 contacts a topmost surface of the sacrificial insulator layer 12L.

The oxide material 16 can include a trench oxide such, for example, silicon dioxide. The oxide material 16 can be formed by a deposition process such as, for example, chemical vapor deposition or plasma enhanced chemical vapor deposition. A planarization process (such as, for example, chemical mechanical polishing and/or grinding) or an etch back process may follow the deposition of the trench oxide.

Figure 4:
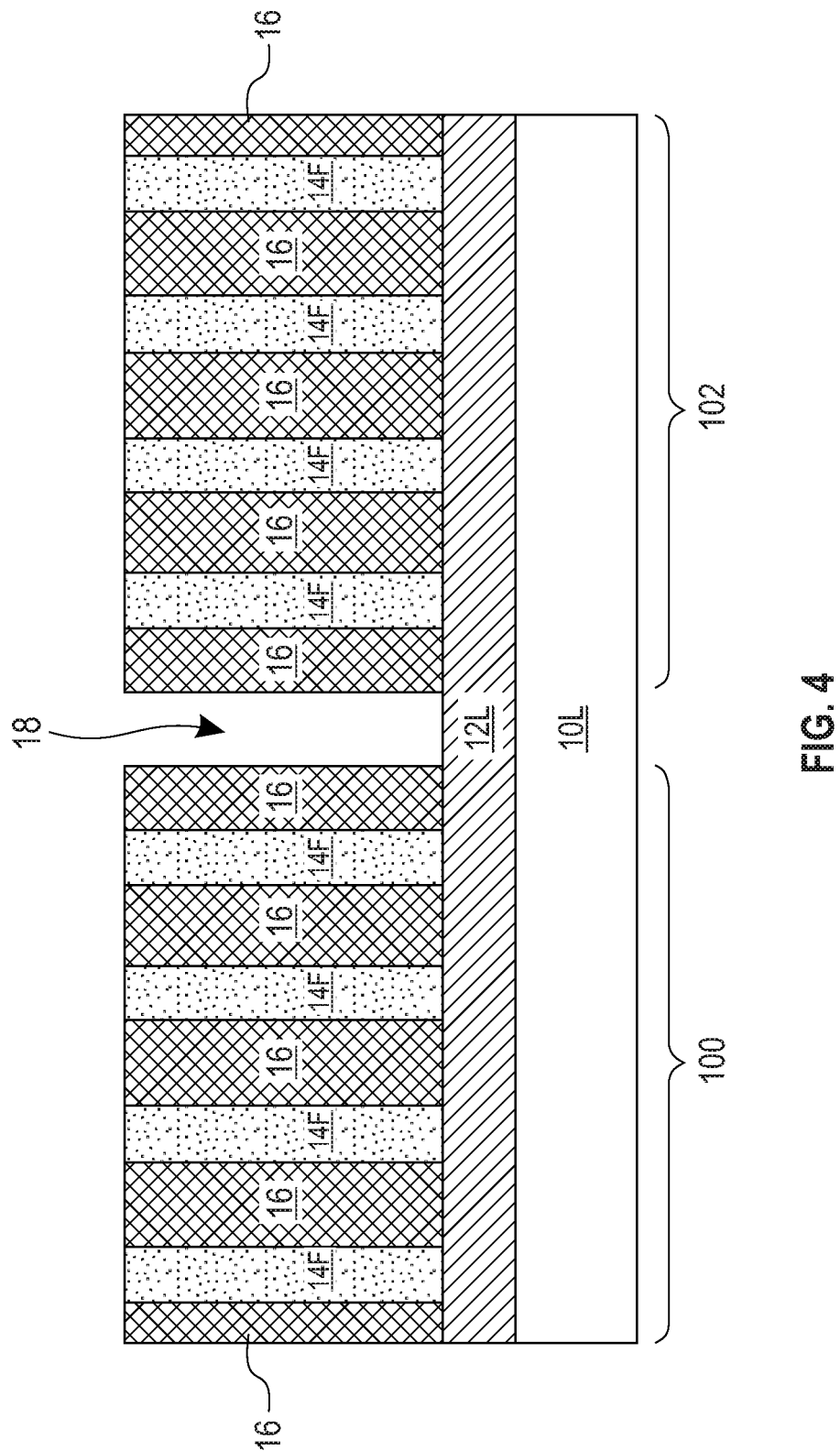
FIG. 4 is a cross sectional view of the exemplary semiconductor structure of FIG. 3 after forming an opening by removing one silicon germanium alloy fin to provide a first device region and a second device region.

Referring now to FIG. 4, there is illustrated the exemplary semiconductor structure of FIG. 3 after forming an opening 18 by removing one silicon germanium alloy fin 14F to provide a first device region 100 and a second device region 102. The opening 18 exposes a portion of the topmost surface of the sacrificial insulator layer 12L. The opening 18 can be formed utilizing lithography and etching as defined above. Although a single opening 18 is formed, a plurality of openings can be formed to define multiple device regions, each device region including a set of silicon germanium alloy fins.

In the illustrated embodiment, the first device region 100 defines a first region in which a first semiconductor device having a first conductivity (i.e., n-type or p-type) can be subsequently formed, while the second device region 102 defines a second region in which a second semiconductor device having a second conductivity that is opposite to the first conductivity can be subsequently formed. In one example, the first device region 100 defines a first region in which an n-type semiconductor device (i.e., nFET) can be subsequently formed, while the second device region 102 defines a second region in which a p-type semiconductor device (i.e., pFET) can be subsequently formed.

Figure 5:
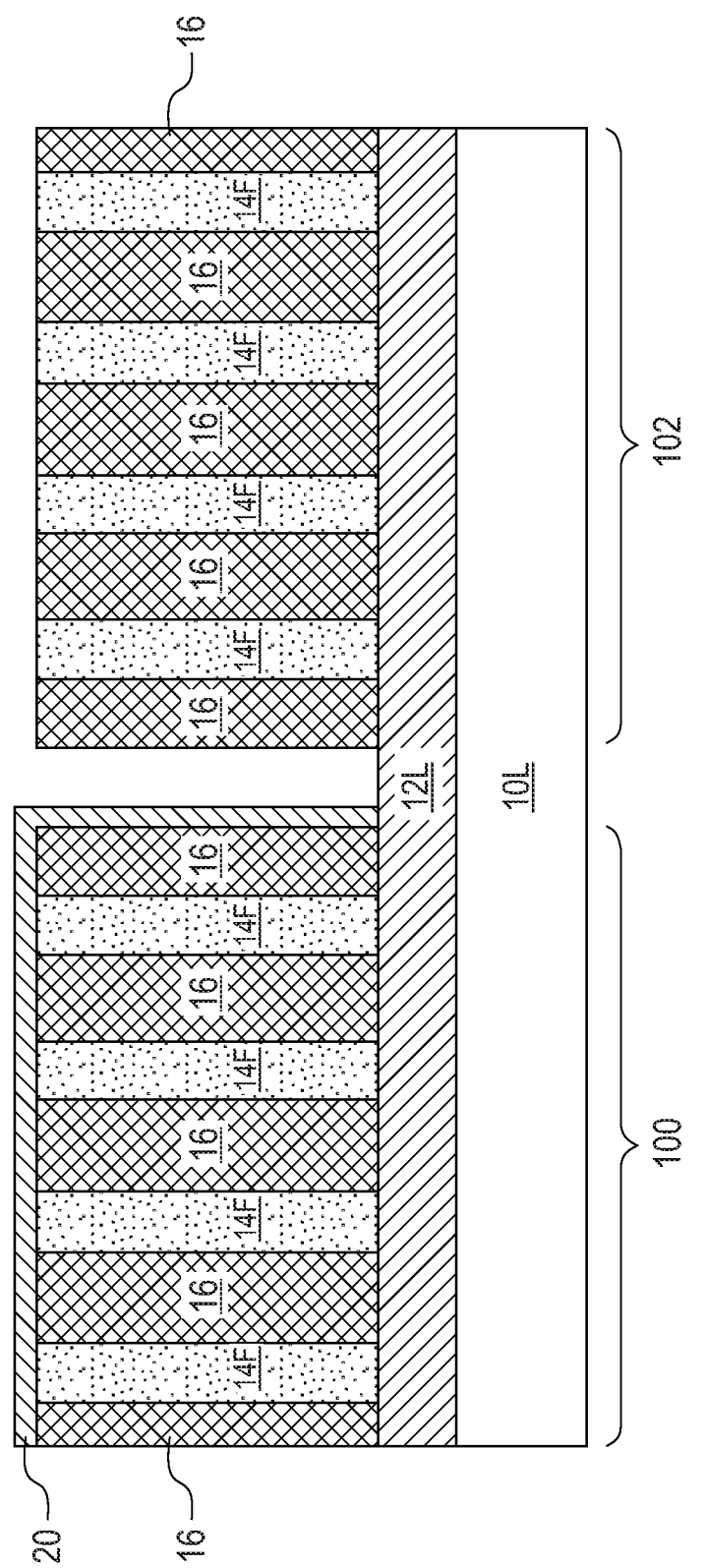
FIG. 5 is a cross sectional view of the exemplary semiconductor structure of FIG. 4 after forming a first mask over the first device region, while leaving the second device region exposed.

Referring now to FIG. 5, there is illustrated the exemplary semiconductor structure of FIG. 4 after forming a first mask 20 over the first device region 100, while leaving the second device region 102 exposed. As is shown, the first mask 20 covers (i.e., protects) the exposed topmost surfaces of each silicon germanium alloy fin 14F and each oxide material 16 within the first device region 100. A sidewall surface of the oxide material 16 that is laterally adjacent the opening 18, and within the first device region 100, is also covered by the first mask 20.

The first mask 20 that is employed in the present application comprises a dielectric material that has a different etch selectivity than the oxide material 16 and the sacrificial insulator layer 12L. In one embodiment, the first mask 20 can be a nitride hard mask such as, for example, silicon nitride, an oxynitride hard mask such as, for example, silicon oxynitride, a photoresist or any multilayered stack thereof. The first mask 20 can be formed utilizing a deposition process such as, for example, chemical vapor deposition, plasma enhanced chemical vapor deposition or spin-coating. Lithography and etching can also be used to define the first mask 20.

The first mask 20 may have a thickness from 5 nm to 20 nm; although other thicknesses that are lesser than, or greater than, the aforementioned range may also be used as the thickness of the first mask 20.

Figure 6:
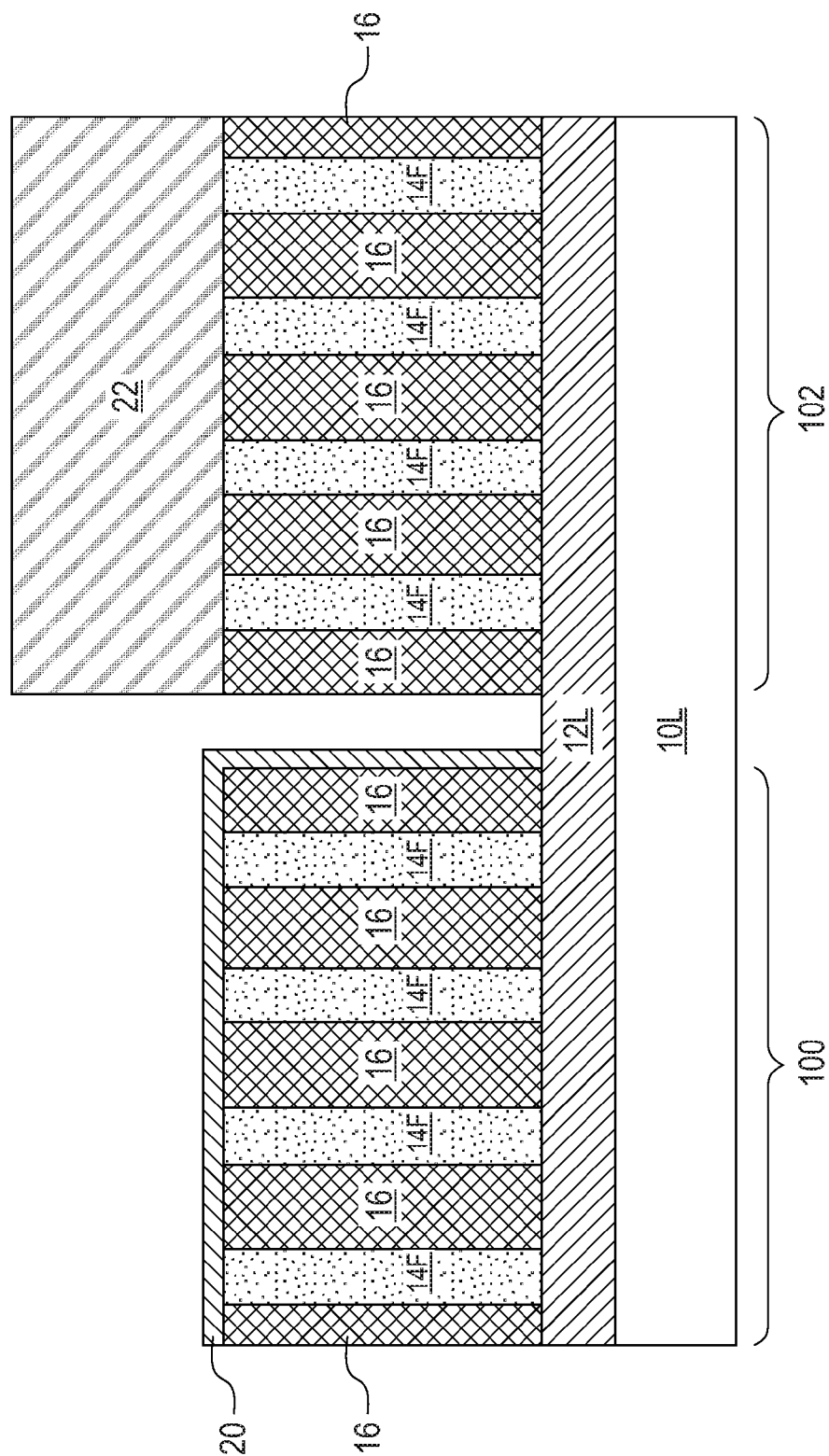
FIG. 6 is a cross sectional view of the exemplary semiconductor structure of FIG. 5 after forming a germanium layer within the second device region.

Referring now to FIG. 6, there is illustrated the exemplary semiconductor structure of FIG. 5 after forming a germanium layer 22 within the second device region 102. As is shown, the first hard mask 20 remains over the first device region 100 after formation of the germanium layer 22. In one embodiment, the germanium layer 22 is a pure germanium material that is relaxed. The germanium layer 20 may also include from 90 atomic percent up to 99.99 atomic percent of germanium and the remaining being silicon; the amount of germanium within the germanium layer must be greater than the first content mentioned above. Germanium layer 22 is a relaxed layer. In one embodiment, germanium layer 22 has a relaxation value from 80% or greater. In one embodiment, the germanium layer 22 may be undoped. In another embodiment, the germanium layer 22 may be doped with As or another like Group VA dopant species.

The germanium layer 22 has a bottommost surface that directly contacts a topmost surface of each silicon germanium alloy fin 14F and each oxide material 16 within the second device region 102. The sidewalls of the germanium layer 22 are vertically aligned with the outermost sidewall of each outermost oxide material 16 within the second device region 102.

The germanium layer 22 can be formed utilizing an epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In the present application, the germanium layer 22 has an epitaxial relationship with exposed topmost surface of each of the silicon germanium alloy fins 14F within the second device region 102.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the germanium layer 22 can be performed utilizing any well known precursor gas or gas mixture including for example, a germanium containing precursor gas (such as a germane). When silicon is present, a silicon containing precursor gas such as, for example, a silane may also be employed in conjugation with the germanium containing precursor gas. Carrier gases like hydrogen, nitrogen, helium and argon can be used.

In one embodiment, the dopant that can be present in the germanium layer 22 can be introduced into the precursor gas that provides the germanium layer 22. In another embodiment, the dopant can be introduced into an intrinsic layer of germanium by utilizing one of ion implantation or gas phase doping.

In some embodiments, the eptiaxially grown or deposited layer of germanium can be patterned by lithography and etching to provide the germanium layer 22 shown in FIG. 6.

Figure 7:
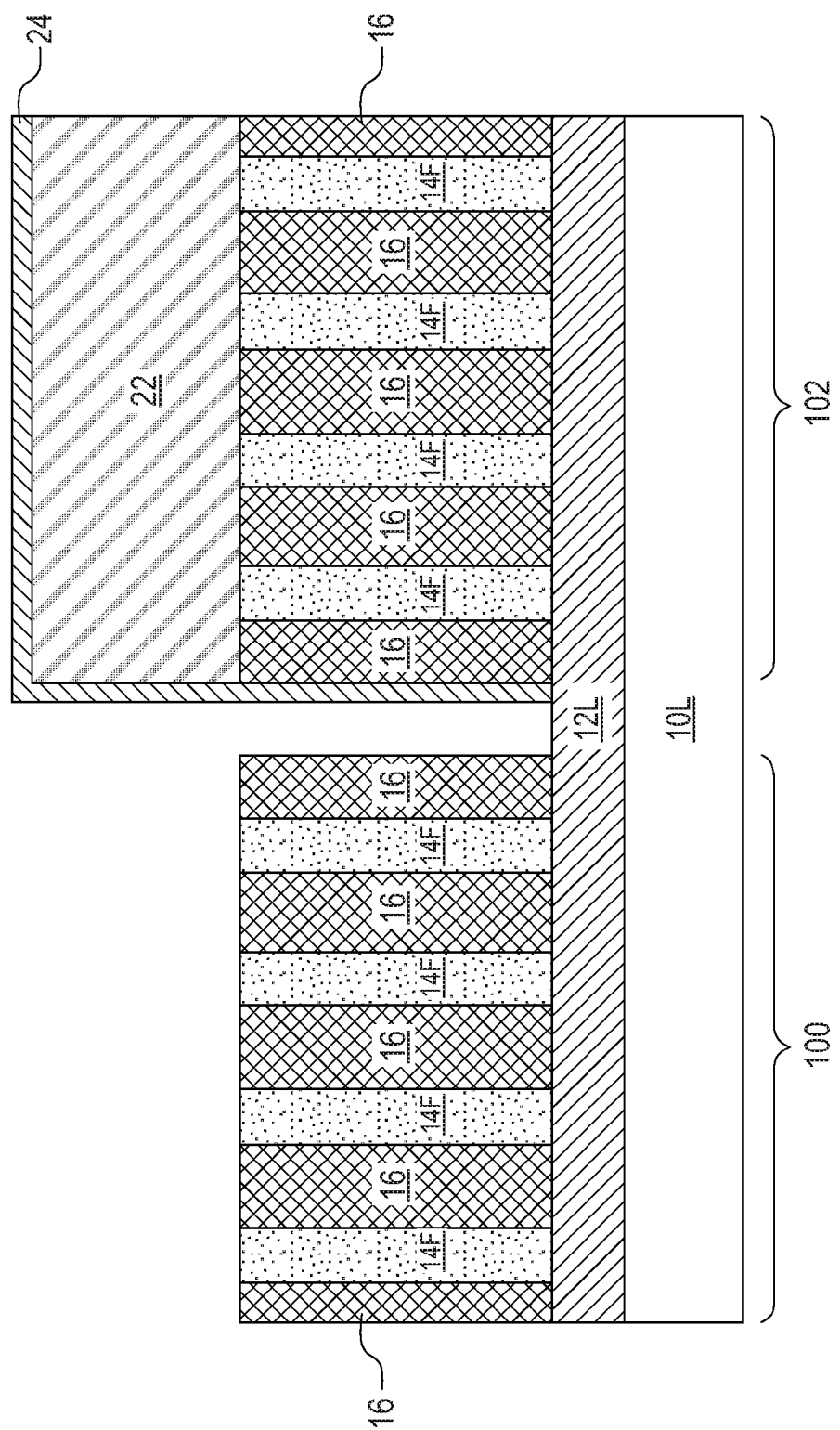
FIG. 7 is a cross sectional view of the exemplary semiconductor structure of FIG. 6 after removing the first mask and forming a second mask over the second device region.

Referring now to FIG. 7, there is illustrated the exemplary semiconductor structure of FIG. 6 after removing the first mask 20 and forming a second mask 24 over the second device region 102. The removal of the first mask 20 comprises an etching process that is selective in removing the dielectric material that provides the first mask 20 relative to the oxide material 16, the silicon germanium alloy fins 14F, the sacrificial insulator layer 12L and the germanium layer 22. The second mask 24 may include one of the dielectric materials mentioned above for the first mask 20. The second mask 24 may be formed utilizing the same technique as mentioned above in forming the first mask 20. The second mask 24 covers (i.e., protects) the topmost surface and sidewalls of the germanium layer 22 and outer sidewalls of each outermost oxide material 16 within the second device region 102.

Figure 8:
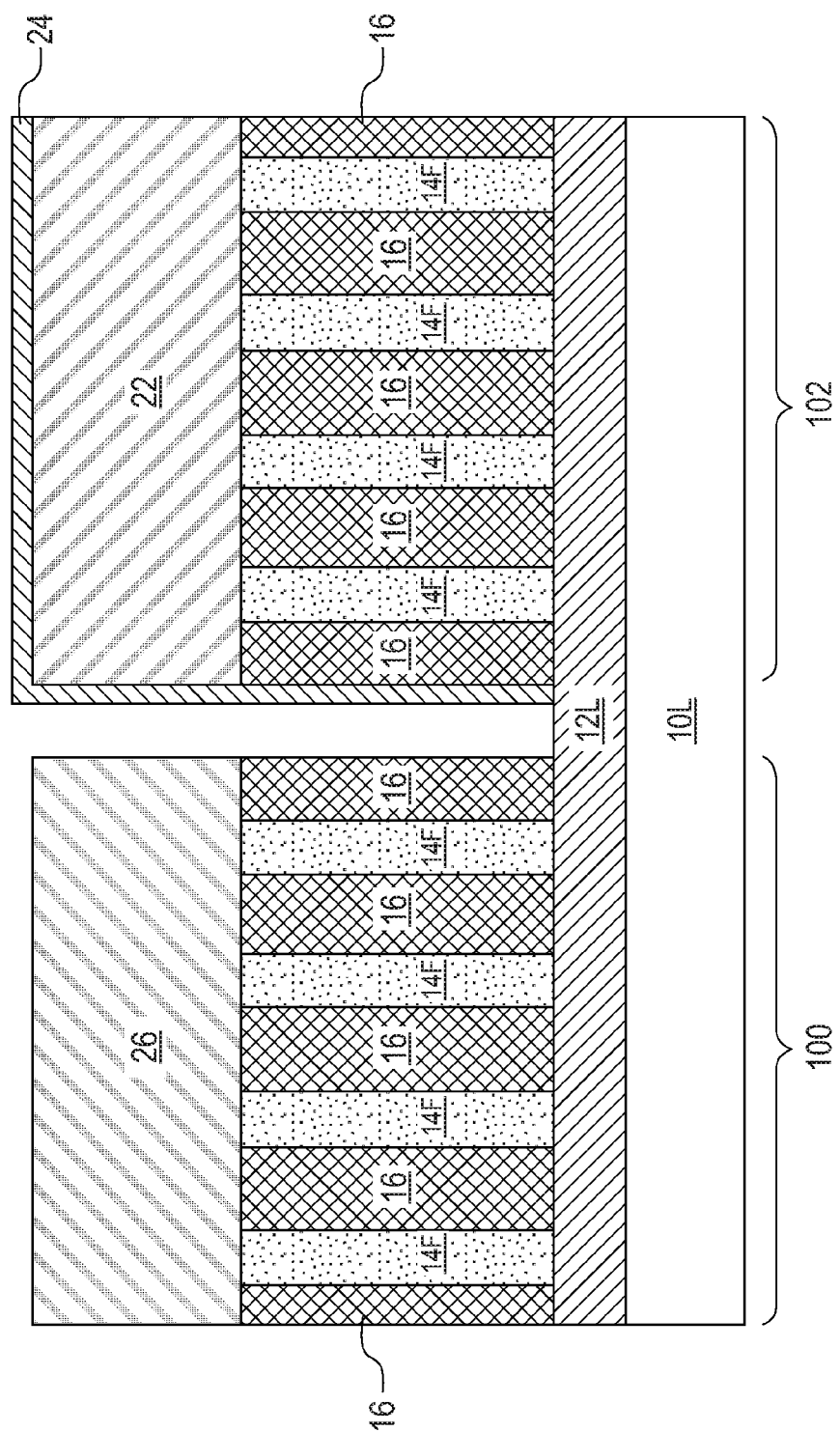
FIG. 8 is a cross sectional view of the exemplary semiconductor structure of FIG. 7 after forming a silicon germanium alloy layer having a second germanium content within the first device region, wherein the second germanium content is less than the first germanium content.

Referring now to FIG. 8, there is illustrated the exemplary semiconductor structure of FIG. 7 after forming a silicon germanium alloy layer 26 having a second germanium content within the first device region 100, wherein the second germanium content is less than the first germanium content. In one embodiment, the second germanium content is less than 70 atomic percent germanium.

The silicon germanium alloy layer 26 is relaxed. In one embodiment, the silicon germanium alloy layer 26 has a relaxation value from 80% or greater. In one embodiment, the silicon germanium alloy layer 26 may be undoped. In another embodiment, the silicon germanium alloy layer 26 may be doped with a Group III dopant species.

The silicon germanium alloy layer 26 has a bottommost surface that directly contacts a topmost surface of each silicon germanium alloy fin 14F and each oxide material 16 within the first device region 100. The sidewalls of the silicon germanium alloy layer 26 are vertically aligned with the outermost sidewall of each outermost oxide material 16 within the first device region 100.

The silicon germanium alloy layer 26 can be formed utilizing an epitaxial growth (or deposition) process similar to the one mentioned above in providing the germanium layer 22. In the present application, the silicon germanium alloy layer 26 has an epitaxial relationship with exposed topmost surface of each of the silicon germanium alloy fins 14F within the first device region 100. The epitaxial growth of the silicon germanium alloy layer 26 can be performed utilizing any well known precursor gas or gas mixture including for example, a gas mixture of a silicon containing precursor gas (such as a silane) and a germanium containing precursor gas (such as a germane). Carrier gases like hydrogen, nitrogen, helium and argon can be used.

In one embodiment, the dopant that can be present in the silicon germanium alloy layer 26 can be introduced into the precursor gas that provides the silicon germanium alloy layer 26. In another embodiment, the dopant can be introduced into an intrinsic layer of a silicon germanium alloy by utilizing one of ion implantation or gas phase doping.

In some embodiments, the eptiaxially grown or deposited layer of silicon germanium alloy can be patterned by lithography and etching to provide the silicon germanium alloy layer 26 shown in FIG. 7.

Figure 9:
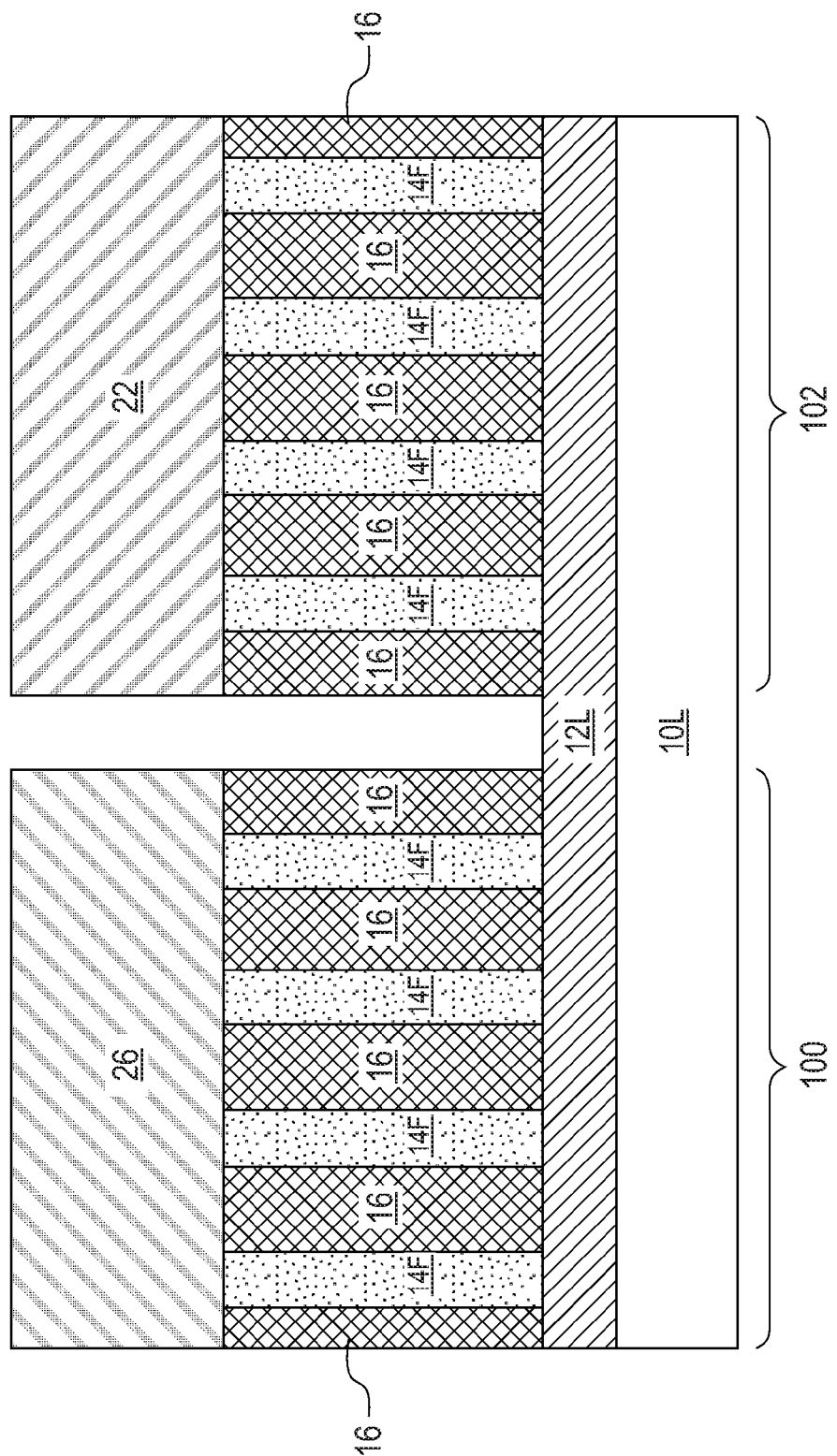
FIG. 9 is a cross sectional view of the exemplary semiconductor structure of FIG. 8 after removing the second mask from the second device region.

Referring now to FIG. 9, there is illustrated the exemplary semiconductor structure of FIG. 8 after removing the second mask 24 from the second device region 102. The removal of the second mask 24 comprises an etching process that is selective in removing the dielectric material that provides the second mask 24 relative to the oxide material 16, the silicon germanium alloy fins 14F, sacrificial insulator layer 12L, the germanium layer 22 and the silicon germanium alloy layer 26.

Although the present application describes and illustrates the processing of the second device region 102 prior to processing of the first device region 100, the present application can also work when the first device region 100 is processed prior to processing the second device region 102. That is, the order of forming the germanium layer 22 and the silicon germanium alloy layer 26 may be reversed.

Figure 10:
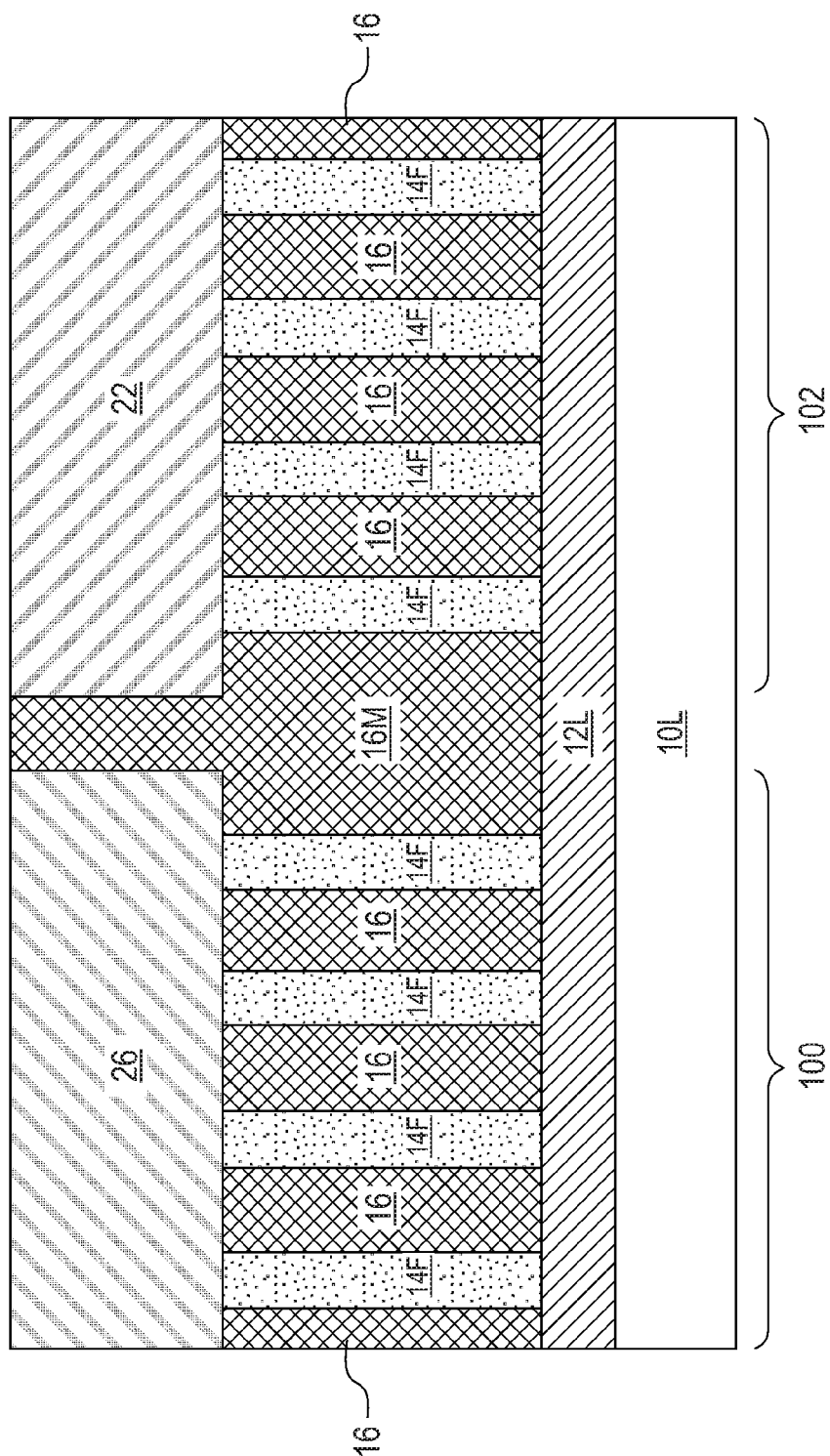
FIG. 10 is a cross sectional view of the exemplary semiconductor structure of FIG. 9 after refilling the opening and a gap located between the germanium layer and the silicon germanium alloy layer having the second germanium content with a same trench oxide as used to provide the oxide material.

Referring now to FIG. 10, there is illustrated the exemplary semiconductor structure of FIG. 9 after refilling the opening 18 and a gap (not specifically labeled) located between the germanium layer 22 and the silicon germanium alloy layer 26 having the second germanium content with a same trench oxide as used to define oxide material 16. The refilling of the opening 18 and the gap located between the germanium layer 22 and the silicon germanium alloy layer 26 with the same trench oxide as used to define oxide material 16 can be performed utilizing the same technique as mentioned above in forming the oxide material 16. In one example, the refilling may include deposition of a trench oxide and a planarization process.

As is shown in FIG. 10, the refilling of the opening 18 and the gap located between the germanium layer 22 and the silicon germanium alloy layer 26 with the same trench oxide as used to define oxide material 16 provides an oxide material section 16M that has a topmost surface that is coplanar with a topmost surface of both the germanium layer 22 and the silicon germanium alloy layer 26.

Figure 11:
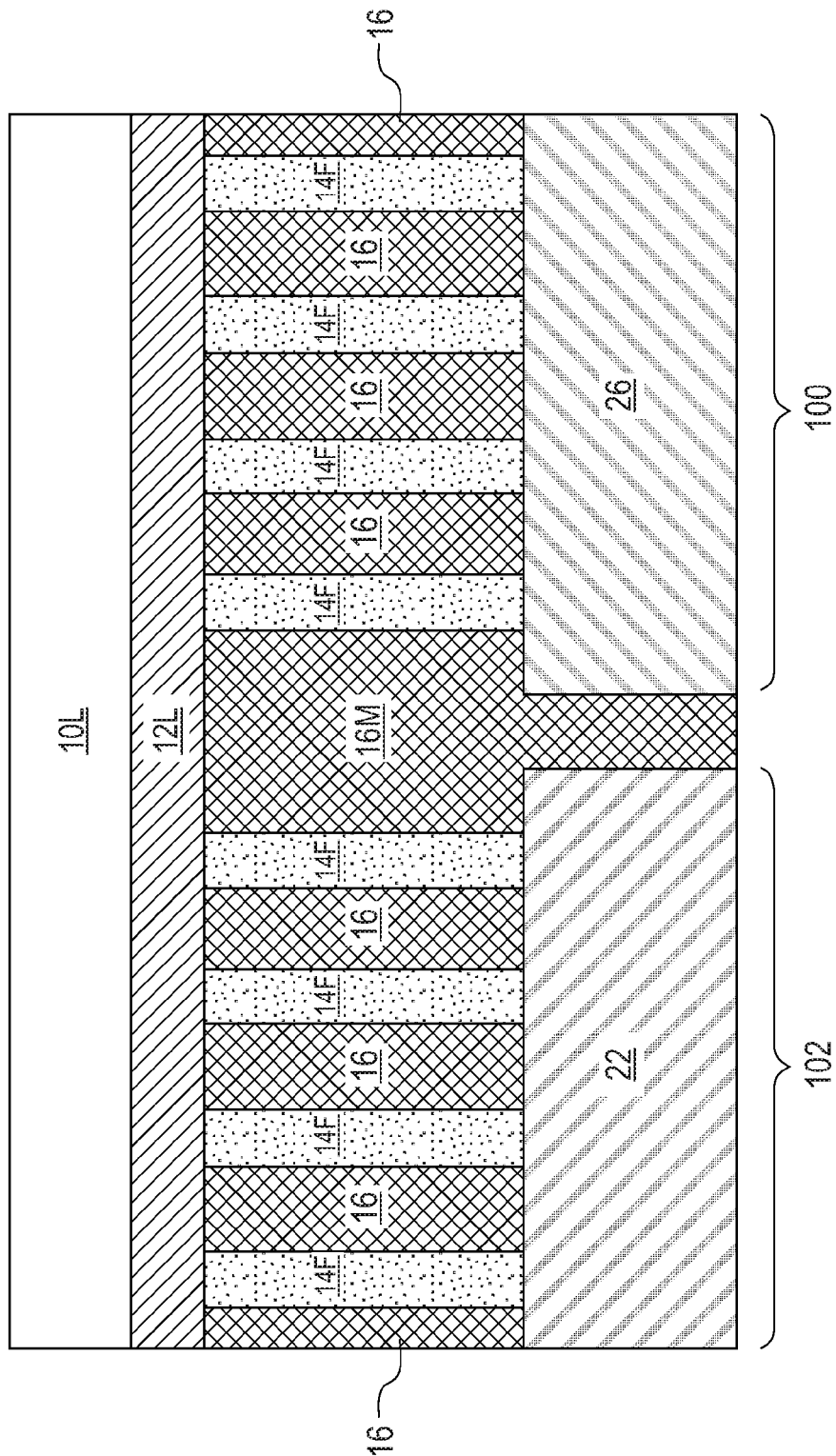
FIG. 11 is a cross sectional view of the exemplary semiconductor structure of FIG. 10 after rotating the structure 180°.

Referring now to FIG. 11, there is illustrated the exemplary semiconductor structure of FIG. 10 after rotating the structure 180°. The rotating of the structure of FIG. 10 by 180° may be performed by hand or a mechanical means such as, for example, a robot arm can be used.

Figure 12:
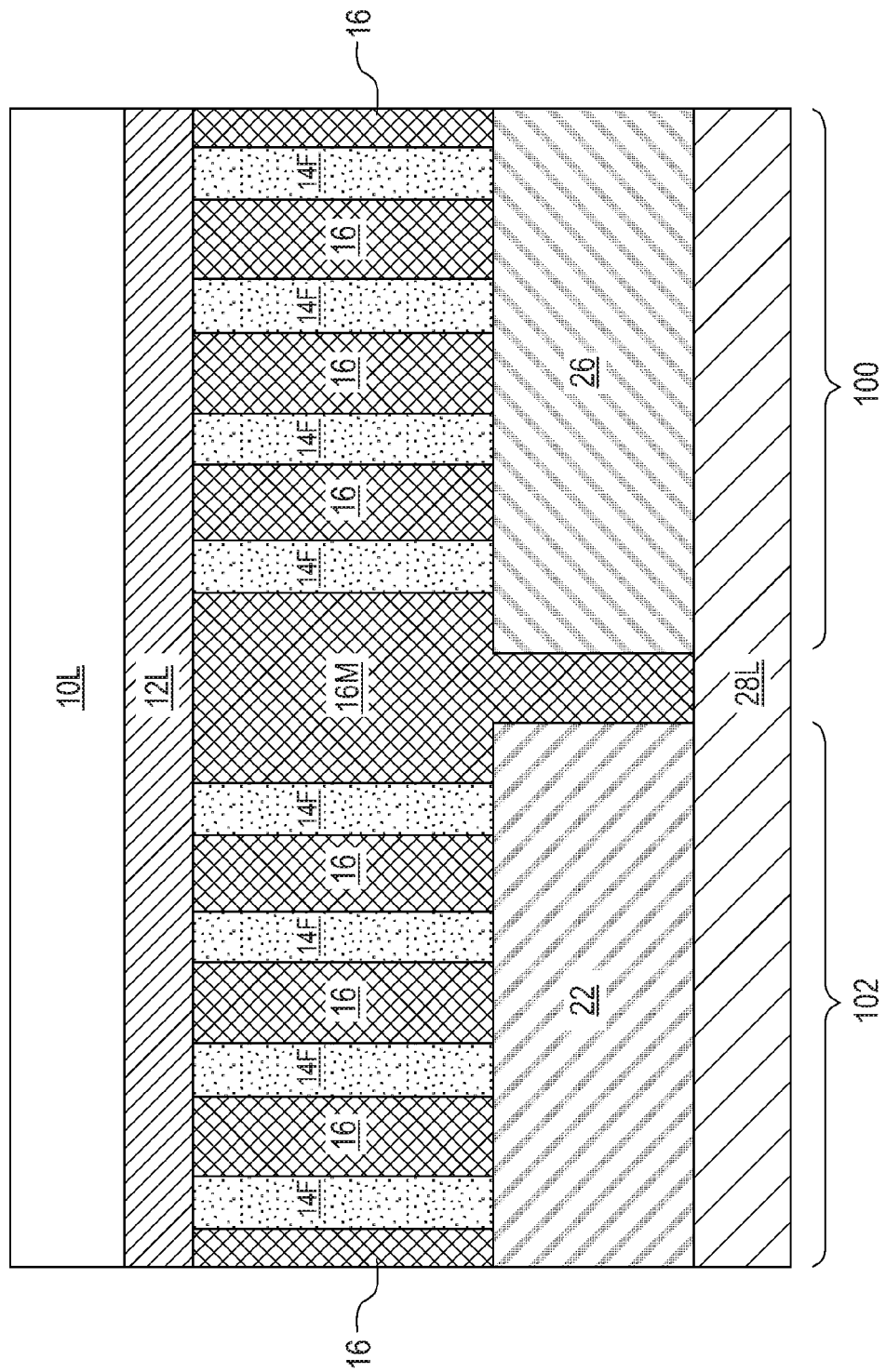
FIG. 12 is a cross sectional view of the exemplary semiconductor structure of FIG. 11 after bonding the structure to a base substrate.

Referring now to FIG. 12, there is illustrated the exemplary semiconductor structure of FIG. 11 after bonding the structure to a base substrate 28L. As is shown, an exposed surface of the base substrate 28L contacts an exposed surface of the germanium layer 22, an exposed surface of the oxide material section 16M and an exposed surface of the silicon germanium layer 26.

The base substrate 28L may include one of the materials mentioned above for the sacrificial handle substrate 10L. In one embodiment, the base substrate 28L includes a semiconductor material such as, for example, single crystalline silicon.

The bonding of the base substrate 28L to the exposed surface of the germanium layer 22, the exposed surface of the oxide material section 16M and the exposed surface of the silicon germanium layer 26 includes providing a base substrate 28L, bringing the base substrate 28L into intimate contact with the exposed surfaces of the germanium layer 22, the oxide material section 16M and the silicon germanium layer 26, and bonding, with or without an external applied force, the two structures together. The bonding may be performed at a temperature from 20° C. to 100° C.

Figure 13:
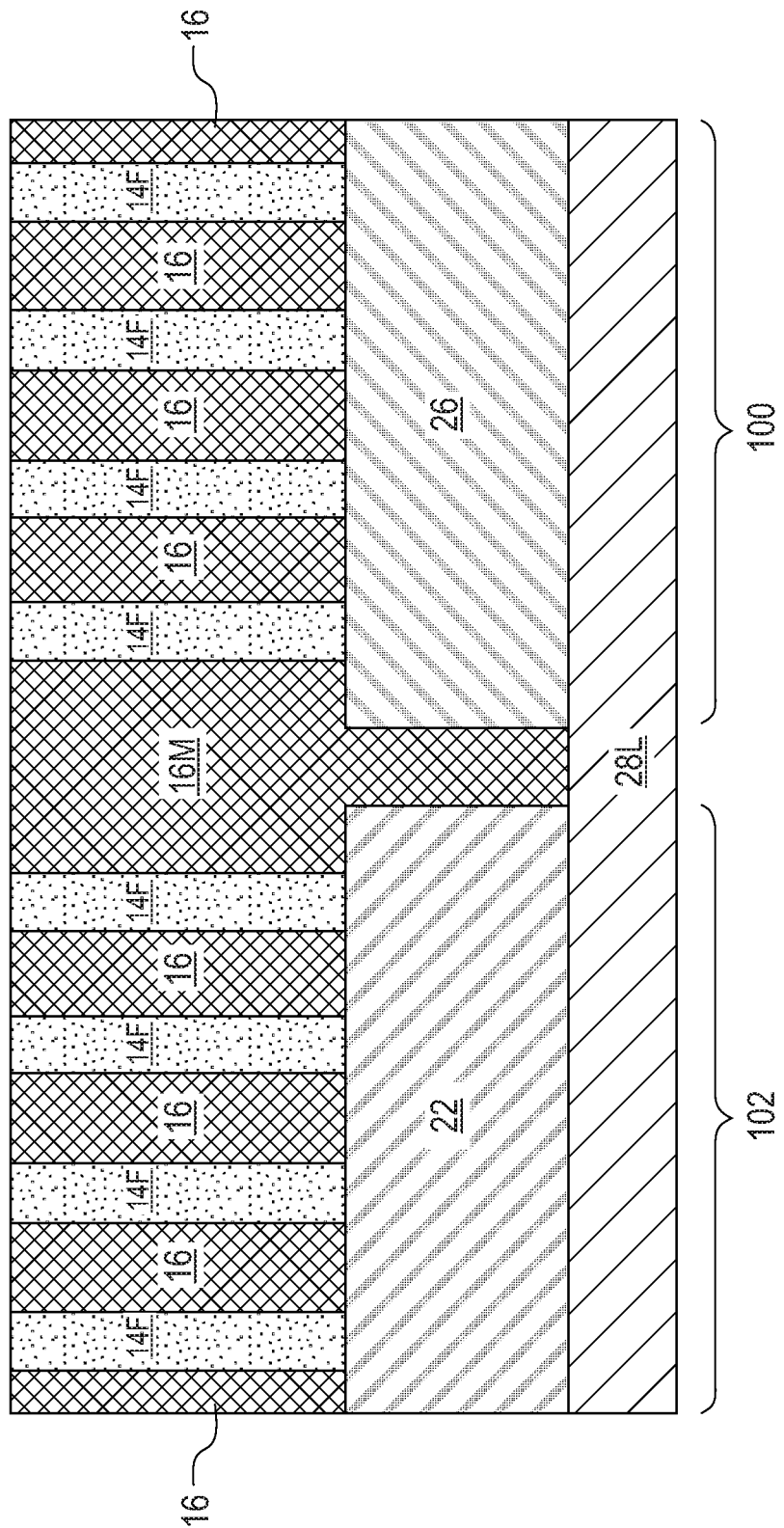
FIG. 13 is a cross sectional view of the exemplary semiconductor structure of FIG. 12 after removing the sacrificial handle substrate and the sacrificial insulator layer.

Referring now to FIG. 13, there is illustrated the exemplary semiconductor structure of FIG. 12 after removing the sacrificial handle substrate 10L and the sacrificial insulator layer 12L. The removal of the sacrificial handle substrate 10L and the sacrificial insulator layer 12L can be performed utilizing at least one material removal process such as, for example, planarization and/or etching. In one embodiment, the sacrificial handle substrate 10L and the sacrificial insulator layer 12L are removed in a single step. In such an embodiment, a planarization process can be used to remove both the sacrificial handle substrate 10L and the sacrificial insulator layer 12L. In another embodiment, the sacrificial handle substrate 10L and the sacrificial insulator layer 12L are removed in separate steps. In one example, a planarization process can be used to remove the sacrificial handle substrate 10L, and then an etching process may be used to remove the sacrificial insulator layer 12L.

The removal of the sacrificial handle substrate 10L and the sacrificial insulator layer 12L exposes the surfaces of the silicon germanium alloy fins 14F and the dielectric oxide 16 in the second device region 102 that are opposite the surfaces of the silicon germanium alloy fins 14F and the oxide material 16 that are in direct physical contact with the germanium layer 22. Likewise, the removal of the sacrificial handle substrate 10L and the sacrificial insulator layer 12L exposes the surfaces of the silicon germanium alloy fins 14F and the oxide material 16 in the first device region 100 that are opposite the surfaces of the silicon germanium alloy fins 14F and the dielectric oxide 16 that are in direct physical contact with the silicon germanium alloy layer 26. As is shown, a portion of the oxide material section 16M is also exposed.

Figure 14:
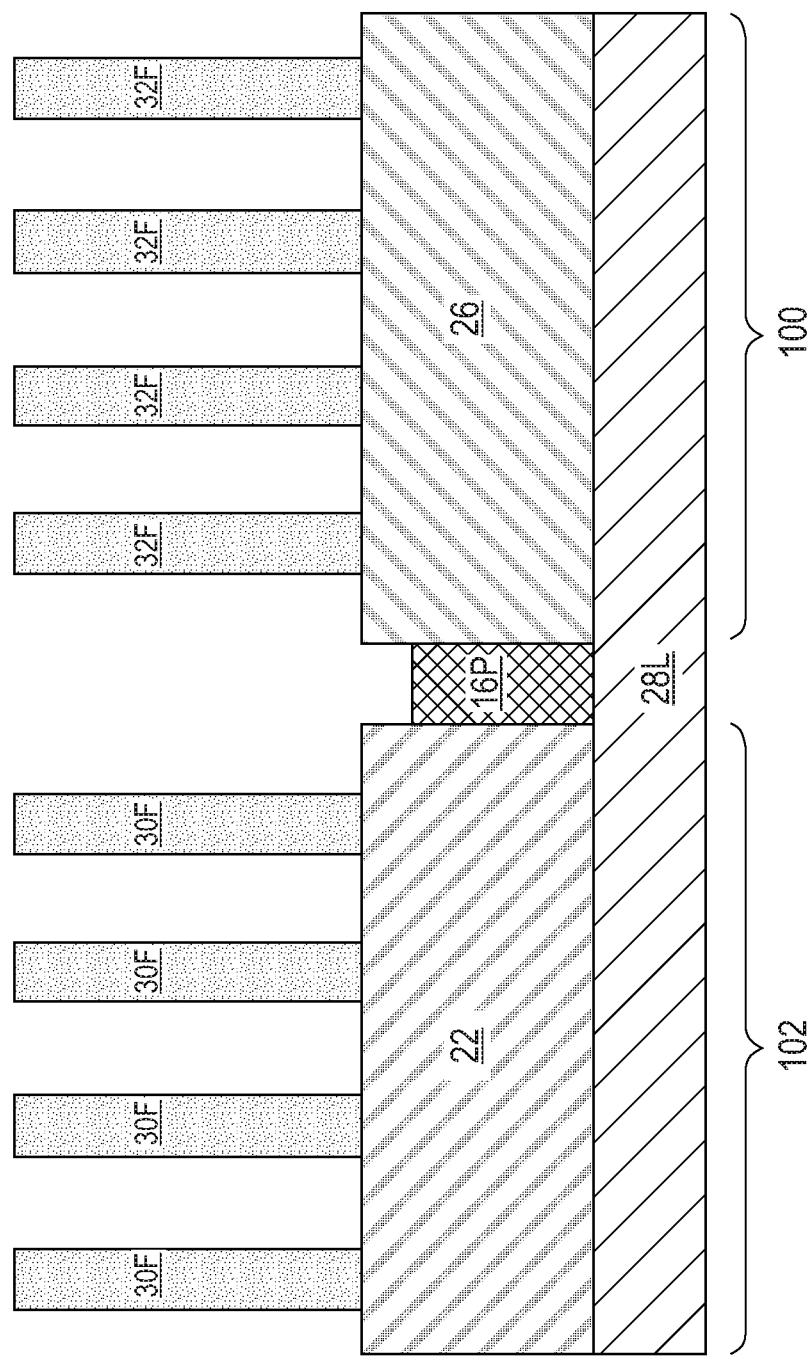
FIG. 14 is a cross sectional view of the exemplary semiconductor structure of FIG. 13 after optionally recessing the oxide material.

Referring now to FIG. 14, there is illustrated the exemplary semiconductor structure of FIG. 13 after optionally recessing the oxide material 16 including the oxide material section 16M. A portion of the oxide material section 16M remains between the germanium layer 22 and the silicon germanium alloy layer 26. The remaining portion of the oxide material section 16M is referred to herein as an oxide material portion 16P. Oxide material portion 16P has a topmost surface that is located beneath the coplanar topmost surfaces of the germanium layer 22 and the silicon germanium alloy layer 26. A bottommost surface of the oxide material portion 16P is coplanar with a bottommost surface of both the germanium layer 22 and the silicon germanium alloy layer 26. The recessing of the oxide material including oxide material section 16M may be performed utilizing an anisotropic etch that is selective in removing oxide as compared to germanium and a silicon germanium alloy. In one example, a wet etch or a reactive ion etch can be used to recess the oxide material.

In accordance with the present application, each silicon germanium alloy fin that is located on the germanium layer 22 and within the second device region 102 is compressively strained, while each silicon germanium alloy fin that is located on the silicon germanium alloy layer 26 and within the first device region is tensely strained. Each compressively strained silicon germanium alloy fin is labeled as element 30F, and each tensely strained silicon germanium alloy fin is labeled as element 32F; the compressively strained silicon germanium alloy fin and the tensely strained silicon germanium alloy fin 32F both have the first germanium content mentioned above. In the present application, the strain is intrinsically introduced into each of the silicon germanium alloy fins, not externally introduced as is the case with prior art silicon germanium alloy fins having a high percentage of germanium. By "intrinsically strained" it is meant that the stain comes from within the material itself; i.e., no extrinsic strain.

Each compressively strained silicon germanium alloy fin 30F within the second device region 102 is located on a bulk substrate (i.e., the germanium layer 22), while each tensely strained silicon germanium alloy fin 32F within the first device region 100 is located on another bulk substrate (i.e., the silicon germanium alloy layer 26). It is noted that while the present application describes and illustrates a plurality of intrinsically strained silicon germanium alloy fins in each device region (100, 102), the present application can be used to form a single intrinsically strained silicon germanium alloy fin within each device region (100, 102).

Figure 15:
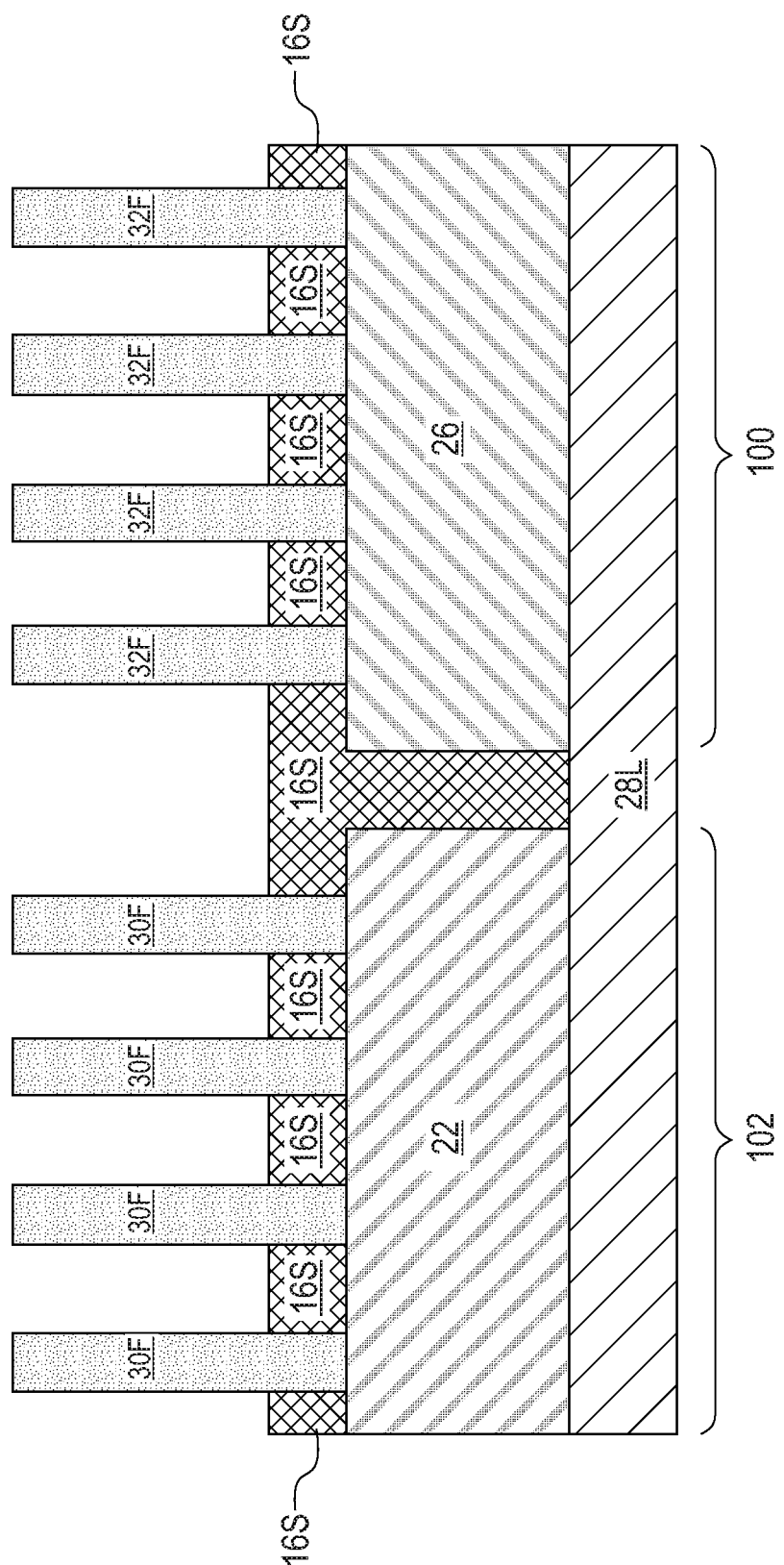
FIG. 15 is a cross sectional view of the exemplary semiconductor structure of FIG. 14 after forming an oxide structure between each silicon germanium alloy fin of the first germanium content that is present atop the germanium layer and the silicon germanium layer of the second germanium content.

Referring now to FIG. 15, there is illustrated the exemplary semiconductor structure of FIG. 14 after forming an oxide structure 16S between each intrinsically strained silicon germanium alloy fin (30F, 32F) having the first germanium content that is present atop both the germanium layer 22 and the silicon germanium layer 26 of the second germanium content. In this embodiment, the oxide structure 16S can be formed by deposition of another trench oxide material, followed by an optional etch back process. In such an embodiment, the another trench oxide material includes a same trench oxide material as the oxide material portion 16P.

In some embodiments, and when the processing step described in FIG. 14 is omitted, the oxide structure 16S may be formed by recessing the oxide material 16 including the oxide material portion 16M shown in FIG. 13.

FIGS. 14-15 illustrate an exemplary semiconductor structure of the present application. The structure includes a compressively strained silicon germanium alloy fin 30F of a first germanium content extending upwards from a surface of a germanium layer 22. The structure further includes a tensely strained silicon germanium alloy fin 32F of the first germanium content extending upwards from a surface of a silicon germanium alloy layer 26 having a second germanium content that is less than the first germanium content. In accordance with the present application, the germanium layer 22 and the silicon germanium alloy layer 26 are spaced apart from each other by a gap (not specifically labeled but obvious to one skilled in the art when viewing FIGS. 14 and 15). The gap is filled with an oxide material.

As is shown, a topmost surface of each compressively strained silicon germanium alloy fin 30F is coplanar with a topmost surface of each tensely silicon germanium alloy fin 32F, and a bottommost surface of each compressively strained silicon germanium alloy fin 30F is coplanar with a bottommost surface of each tensely silicon germanium alloy fin 32F. As such, each compressively strained silicon germanium alloy fin 30F and each tensely silicon germanium alloy fin 32F has a same height.

Figure 16:
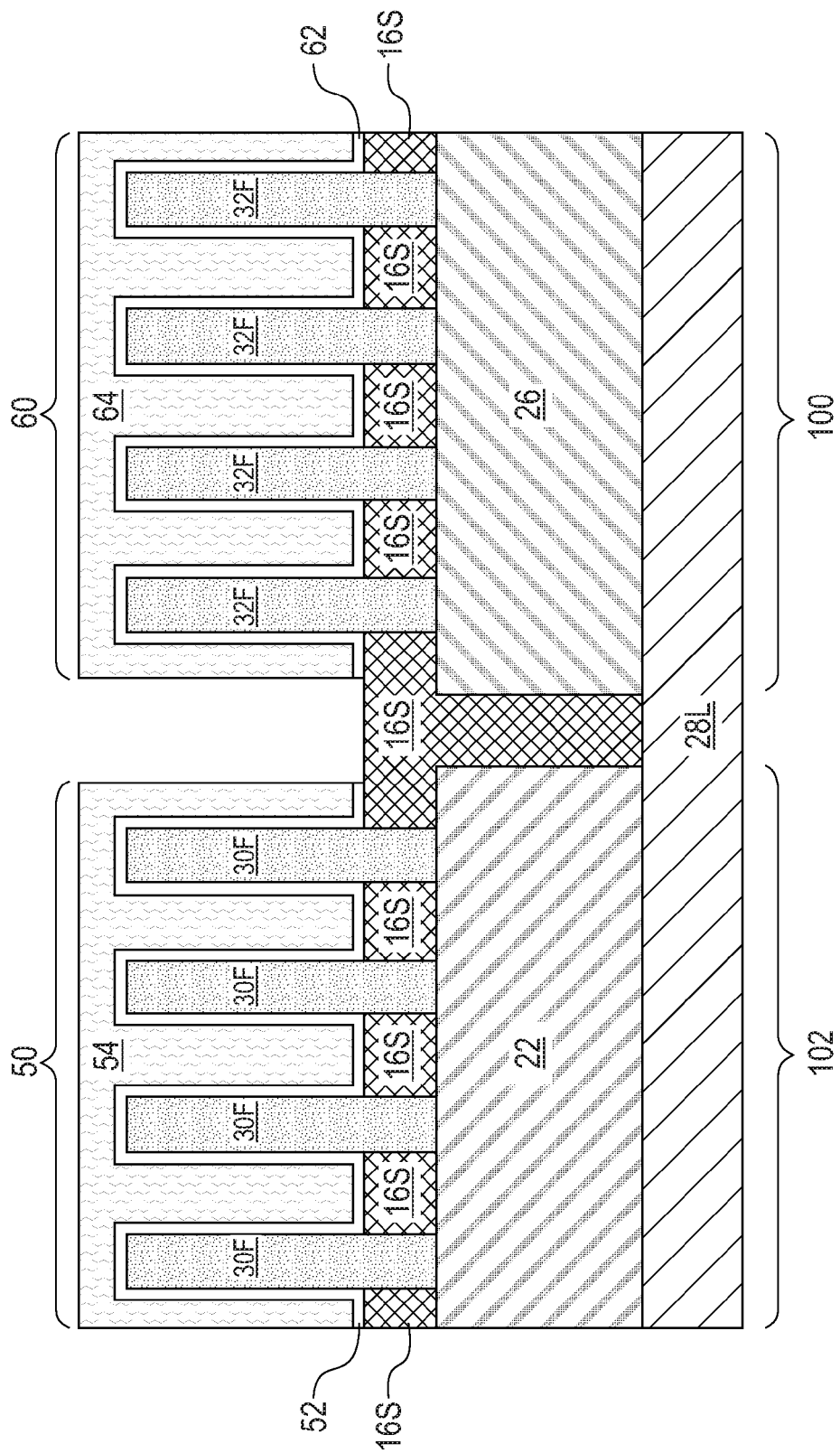
FIG. 16 is a cross sectional view of the exemplary semiconductor structure of FIG. 15 after forming a gate structure within the first and second device regions.

Referring now to FIG. 16, there is illustrated the exemplary semiconductor structure of FIG. 15 a forming a gate structure within the first and second device regions. Prior to forming the gate structures, some of the intrinsically strained silicon germanium alloy fins (30F, 32F) within the first and/or second device regions (100, 102) can be cut utilizing any conventional fin cut process. Although the present application describes and illustrates a single gate structure being formed in each device region, a plurality of gate structures can be formed each straddling over a different portion of each intrinsically strained silicon germanium alloy fin (30F, 32F) within the specific device region.

The gate structure within the second device region 102 is labeled as element 50 in the drawing, while the gate structure within the first device region 100 is labeled as element 60 in the drawing. Gate structure 60 that is present in the first device region 100 may be referred to as first gate structure 60, while gate structure 50 that is present in the second device region 102 may be referred to herein as a second gate structure 50. The first gate structure 60 includes a first gate dielectric portion 62 and a first gate conductor portion 64, while the second gate structure 50 includes a second gate dielectric portion 52 and a second gate conductor portion 54. An optional gate cap, not shown, may be formed atop the first and second gate conductor portions. In accordance with the illustrated embodiment of the present application, the first gate structure 60 that is present around each tensely strained silicon germanium alloy fin 32F within the first device region 100 may be referred to herein as a tensely strained nFET device, while the second gate structure 50 that is present around each compressively strained silicon germanium alloy fin 30F within the second device region 102 may be referred to herein as a compressive strained pFET device.

The first and second gate structures (60, 50) straddle over exposed portions of the silicon germanium alloy fins 14F within the first and second device regions (100, 102). By "straddling over" it is meant that each gate structure is present on both sides and atop each intrinsically strained silicon germanium alloy fin (30F, 32F).

In one embodiment, the first and second gate structures (60, 50) are functional gate structures. By "functional gate structure" it is meant a permanent gate structure used to control output current (i.e., flow of carriers in the channel) of a semiconducting device through electrical or magnetic fields.

Each gate dielectric portion (52, 62) may include a gate dielectric material. The gate dielectric material that provides each gate dielectric portion (52, 62) can be an oxide, nitride, and/or oxynitride. In one example, the gate dielectric material that provides each gate dielectric portion (52, 62) can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric, can be formed and used as each gate dielectric portion (52, 62). The first gate dielectric portion 62 may be the same as, or different from, the second gate dielectric portion 52.

The gate dielectric material used in providing the gate dielectric portion (52, 62) can be formed by any deposition process including, for example, chemical vapor deposition (CVD), plasma enhanced chemical vapor deposition (PECVD), physical vapor deposition (PVD), sputtering, or atomic layer deposition. In some embodiments and when different gate dielectric materials are used in providing the gate dielectric portions (52, 62), block mask technology can be used. In one embodiment of the present application, the gate dielectric material used in providing each gate dielectric portion (52, 62) can have a thickness in a range from 1 nm to 10 nm. Other thicknesses that are lesser than, or greater than, the aforementioned thickness range can also be employed for the gate dielectric material that may provide each gate dielectric portion (52, 62).

Each gate conductor portion (54, 64) can include a gate conductor material. The gate conductor material used in providing each gate conductor portion (54, 64) can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. The first gate conductor portion 64 may be the same as, or different from, the second gate conductor portion 54. In one example, the first gate conductor portion 64 may comprise an nFET gate metal, while the second gate conductor portion 54 may comprise a pFET gate metal.

The gate conductor material used in providing the gate conductor portion (54, 64) can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for gate conductor portions (54, 64), block mask technology can be used. In one embodiment, the gate conductor material used in providing each gate conductor portion (54, 64) has a thickness from 50 nm to 200 nm. Other thicknesses that are lesser than, or greater than, the aforementioned thickness range can also be employed for the gate conductor material used in providing each gate conductor portion (54, 64).

If present, gate cap portion of each functional gate structure may include a gate cap material. The gate cap material that provides the gate cap portion may include a hard mask material such as, for example, silicon dioxide, silicon nitride, and/or silicon oxynitride. The hard mask material that provides the gate cap portion located atop the first gate conductor portion 64 may be the same as, or different from, the hard mask material that provides the gap portion atop the second gate conductor portion 54. The hard mask material that provides the gate cap portion can be formed utilizing a conventional deposition process such as, for example, chemical vapor deposition or plasma enhanced chemical vapor deposition. The material that provides the gate cap portion can have a thickness from 5 nm to 20 nm. Other thicknesses that are lesser than, or greater than, the aforementioned thickness range can also be employed as the thickness of the material that provides the gate cap portion.

Each functional gate structure can be formed by providing a functional gate material stack of, from bottom to top, the gate dielectric material, the gate conductor material and, if present, the gate cap material. A patterning process may follow the formation of the functional gate material stack. Block mask technology may be used to selectively provide one of the functional gate structures prior to forming the other functional gate structure.

Next, a gate spacer (not shown) can be formed along sidewall surfaces of each gate structure. The gate spacer may include any gate dielectric spacer material such as, for example, silicon dioxide and/or silicon nitride. The gate spacer can be formed by deposition of a gate dielectric spacer material and thereafter etching the deposited gate dielectric spacer material.

At this point of the present application, epitaxial source/drain regions can be grown from exposed surfaces of each intrinsically strained silicon germanium alloy fin (30F, 32F) that is not covered by the gate structure and gate spacer. The epitaxial source/drain regions include a semiconductor material that is doped with an n-type or p-type dopant. The term "p-type" refers to the addition of impurities to an intrinsic semiconductor that creates deficiencies of valence electrons. In a silicon-containing semiconductor material, examples of p-type dopants, i.e., impurities, include, but are not limited to, boron, aluminum, gallium and indium.

"N-type" refers to the addition of impurities that contributes free electrons to an intrinsic semiconductor. In a silicon containing semiconductor material, examples of n-type dopants, i.e., impurities, include, but are not limited to, antimony, arsenic and phosphorous.

In other embodiments of the present application, and prior to forming the functional gate structures, sacrificial gate structures are formed instead. In yet other embodiments, at least one of the gate structures is a functional gate structure, and at least one other of the gate structures is a sacrificial gate structure. By "sacrificial gate structure" it is meant a material or material stack that serves as a placeholder for a subsequently formed functional gate structure. In such a process, the functional gate structure is formed after the source/drain regions have been formed. In such an embodiment, the gate dielectric portion of the functional gate structure that replaces the sacrificial gate structure may be U-shaped. By "U-shaped" it is meant a material that includes a bottom horizontal surface and a sidewall surface that extends upward from the bottom horizontal surface. When employed, each sacrificial gate structure may include a sacrificial gate dielectric portion, a sacrificial gate material portion and a sacrificial gate cap portion. In some embodiments, each sacrificial gate dielectric portion and/or each sacrificial gate cap portion may be omitted. Each sacrificial gate dielectric portion includes one of the dielectric materials mentioned above for gate dielectric portion. Each sacrificial gate material portion includes one of the gate conductor materials mentioned above for the gate conductor portion. The sacrificial gate cap portion includes one of the gate cap materials mentioned above for the gate cap portion. The sacrificial gate structure can be formed by deposition of the various material layers and then patterning the resultant sacrificial dielectric material sack by utilizing, for example, lithography and etching. Next, gate spacers as mentioned above, and after formation of the source/drain regions, the sacrificial gate structure may be replaced with a functional gate structure as described above.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a compressively strained silicon germanium alloy fin of a first germanium content extending upwards from a surface of a germanium layer; and
   a tensely strained silicon germanium alloy fin of said first germanium content extending upwards from a surface of a silicon germanium alloy layer having a second germanium content that is less than said first germanium content, wherein said germanium layer and said silicon germanium alloy layer are spaced apart from each other.

2. The semiconductor structure of claim 1, wherein said germanium layer and said silicon germanium alloy layer are located on different portions of a topmost surface of a base substrate.

3. The semiconductor structure of claim 2, wherein a topmost surface of said germanium layer is coplanar with a topmost surface of said silicon germanium alloy layer, and a bottommost surface of said germanium layer is coplanar with a bottommost surface of said silicon germanium alloy layer.

4. The semiconductor structure of claim 1, wherein a gap between said germanium layer and said silicon germanium alloy layer is filled with a portion of an oxide structure.

5. The semiconductor structure of claim 4, wherein other portions of said oxide structure surround a lower portion of said compressively strained silicon germanium alloy fin and a lower portion of said tensely strained silicon germanium alloy fin.

6. The semiconductor structure of claim 1, wherein said first germanium content is from 70 atomic percent germanium to 90 atomic percent germanium, and said second germanium content is content is less than 70 atomic percent germanium.

7. The semiconductor structure of claim 1, wherein said compressively strained silicon germanium alloy fin and said tensely strained silicon germanium alloy fin have a same height.

8. The semiconductor structure of claim 7, wherein a topmost surface of said compressively strained silicon germanium alloy fin is coplanar with a topmost surface of said tensely strained silicon germanium alloy fin, and a bottommost surface of said compressively strained silicon germanium alloy fin is coplanar with a bottommost surface of said tensely strained silicon germanium alloy fin.

9. The semiconductor structure of claim 1, wherein a functional gate structure straddles over a portion of said compressively strained silicon germanium alloy fin, and another functional gate structure straddles over a portion of said tensely strained silicon germanium alloy fin.

10. The semiconductor structure of claim 1, wherein said germanium layer is composed of pure germanium.

11. The semiconductor structure of claim 1, wherein said germanium layer is composed of from 90 atomic percent to 99.99 atomic percent germanium and the remainder, up 100 atomic percent, being silicon.

12. The semiconductor structure of claim 1, wherein said germanium layer has a relaxation value of 80% or greater.

13. The semiconductor structure of claim 1, wherein said germanium layer has an epitaxial relationship with said compressively strained silicon germanium alloy fin.

14. The semiconductor structure of claim 1, wherein said silicon germanium alloy layer has a relaxation value of 80% or greater.

15. The semiconductor structure of claim 1, wherein said silicon germanium alloy has an epitaxial relationship with said tensely strained silicon germanium alloy fin.

16. The semiconductor structure of claim 2, wherein said base substrate is composed of single crystalline silicon.

17. The semiconductor structure of claim 9, wherein said functional gate structure and said another functional gate structure are located on an oxide structure that is present surrounding a lower portion of said compressively strained silicon germanium alloy fin and a lower portion of said tensely strained silicon germanium alloy fin.

18. The semiconductor structure of claim 9, wherein said functional gate structure is a compressively strained pFET device, while said another functional gate structure is a tensely strained nFET device.

19. The semiconductor structure of claim 9, wherein said functional gate structure includes a gate dielectric portion that is present on sidewall surfaces and a topmost surface of said compressively strained silicon germanium alloy fin, and said another functional gate structure includes another gate dielectric portion that is present on sidewall surfaces and a topmost surface of said tensely strained silicon germanium alloy fin.

20. A semiconductor structure comprising:
a plurality of compressively strained silicon germanium alloy fins of a first germanium content extending upwards from a surface of a germanium layer; and
a plurality of tensely strained silicon germanium alloy fins of said first germanium content extending upwards from a surface of a silicon germanium alloy layer having a second germanium content that is less than said first germanium content, wherein said germanium layer and said silicon germanium alloy layer are spaced apart from each other and are present on different portions of a base substrate.

* * * * *